United States Patent [19]

Moyal

[11] Patent Number: 4,959,650

[45] Date of Patent: Sep. 25, 1990

[54] DUAL CHANNEL A/D AND D/A CONVERTER WITH IMPROVED ISOLATIONS

[75] Inventor: Miki Moyal, Austin, Tex.

[73] Assignee: Advanced Micro Devices, Inc., Sunnyvale, Calif.

[21] Appl. No.: 375,082

[22] Filed: Jul. 3, 1989

[51] Int. Cl.⁵ .............................................. H03M 1/00
[52] U.S. Cl. ...................................... 341/126; 437/61; 437/65
[58] Field of Search ............... 341/126, 110, 143, 144, 341/145, 150, 155, 159, 172; 437/61, 62, 65, 67

[56] References Cited

U.S. PATENT DOCUMENTS 4,596,976 6/1986 Mangelsdorf et al. .............. 341/159
4,692,738 9/1987 Suzuki ................................. 341/110
4,857,929 8/1989 Katzenstein ......................... 341/145

Primary Examiner—William M. Shoop, Jr.
Assistant Examiner—Brian K. Young
Attorney, Agent, or Firm—Davis Chin

[57] ABSTRACT

A dual channel A/D and D/A converter includes a first channel converter, a second channel converter, and a reference generator all formed on a single semiconductor substrate. The reference generator is disposed intermediate the first channel converter and the second channel converter for effecting crosstalk isolation therebetween. The dual channel converter is formed of a unique differential structure having "coaxial" isolation of bus lines and interconnections, thereby achieving a higher degree of unwanted channel-to-channel crosstalk.

20 Claims, 3 Drawing Sheets

DUAL CHANNEL A/D AND D/A CONVERTER WITH IMPROVED ISOLATIONS

CROSS-REFERENCE TO RELATED APPLICATION

This application is related to application Ser. No. 286,198 filed on Dec. 19, 1988, and entitled "Time Continuous, Differential Analog-to-Digital Converter," Converter", which has now matured into U.S. Pat. No. 4,887,085 issued on Dec. 12, 1989, assigned to the same assignee as the present application.

BACKGROUND OF THE INVENTION

This invention relates generally to telecommunication systems employing A/D and D/A converters and more particularly, it relates to a dual channel A/D and D/A converter for use in a dual subscriber line audio-processing circuit (OSLAC) which performs the functions of converting an analog voice signal into digital PCM samples and converting digital PCM samples back into an analog signal as well as the filtering functions, all associated with the four-wire section of the subscriber line circuitry in a digital switch.

In view of the large number of analog/digital interfaces used in telecommunication systems, there has been a great demand for developing low cost integrated circuits to perform the A/D and D/A functions in the subscriber loop. One of the prior art techniques employs an oversampled multi-channel coder which incorporates four A/D converters with transmit low pass filters on one single chip. This prior art technique is disclosed in a research paper written by Bosco Leung entitled "Multi-Channel TCM A/D Interface Using Oversampling Techniques." It is generally known that A/D converters which have a single ended structure are sensitive to crosstalk from other circuits on a chip. Since there are four converters used on the same chip, there will exist a certain amount of crosstalk between the different channels. Thus, in order to overcome this crosstalk problem the research paper to Leung utilizes a fully differential architecture consisting of a MOS switched-capacitor integrator. The chip with four channels was reported to have a crosstalk of −83 db.

However, the use of switched-capacitor techniques for constructing such A/D converters suffers from the limitation of exposing the switching node to a high impedance state and to clock feed-through digital noise. Since the high impedance node takes a long time to settle down, this may in turn cause crosstalk errors and undesirable noise. Further, this approach has the disadvantage of requiring the use of precisely matched capacitances. Therefore, it has been counted in the fabrication of such switched-capacitor integrator devices on a chip using CMOS technology the need of performing an additional masking step which increases manufacturing costs.

The dual channel A/D and D/A converter of the present invention operates in a differential mode and provides an improved crosstalk isolation by a factor of 7 between the two channels without the use of any switched-capacitor technique. The dual channel converter of the present invention is provided as a part of a dual subscriber line audio-processing circuit (DSLAC) manufactured and sold by AMD, Inc., Sunnyvale, Cal., part No. Am 79CO2/A. The DSLAC is an integrated circuit formed of a single-chip package which integrates the key factors of an analog linecard into one programmable, high performance dual CODEC-filter device for two telephone lines via a transformer or a subscriber line interface circuit (SLIC).

SUMMARY OF THE INVENTION

Accordingly, it is a general object of the present invention to provide a dual channel A/D and D/A converter formed on one silicon substrate, which has traditionally been unavailable.

It is an object of the present invention to provide a dual channel A/D and D/A converter having improved crosstalk isolation.

It is another object of the present invention to provide a dual channel A/D and D/A converter which is formed on a single chip without the use of any switch capacitance techniques or precision capacitors.

It is still another object of the present invention to provide a dual channel A/D and D/A converter which includes a first channel converter, a second channel converter, and a reference generator all formed on a single semiconductor substrate, the reference generator being disposed intermediate the first channel converter and the second channel converter for effecting crosstalk isolation therebetween.

In accordance with these aims and objectives, the present invention is concerned with the provision of a dual channel A/D and D/A converter which includes a first channel converter formed on a single semiconductor substrate for converting between analog and digital signals and a second channel converter formed on the same semiconductor substrate at a predetermined distance from the first channel converter for converting between analog and digital signals. A reference generator is also formed on the semiconductor substrate and is disposed intermediate the first channel converter and the second channel converter for effecting crosstalk isolation therebetween. Clock logic circuitry is also formed on the semiconductor substrate for generating clock signals on clock connection lines. First ground bus connections are associated with the first channel converter and defines a quiet ground bus line. The first quiet ground bus line is disposed around the reference generator to provide isolation from the clock signals. Second ground bus connections are associated with the second channel converter and are separated from the first ground connection bus lines. A barrier is formed around the quiet ground bus line and the reference generator to provide Further isolation between the first and second channels due to the clock signals and other digital blocks such as an ALU, ORAM, IROM, or PLL.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
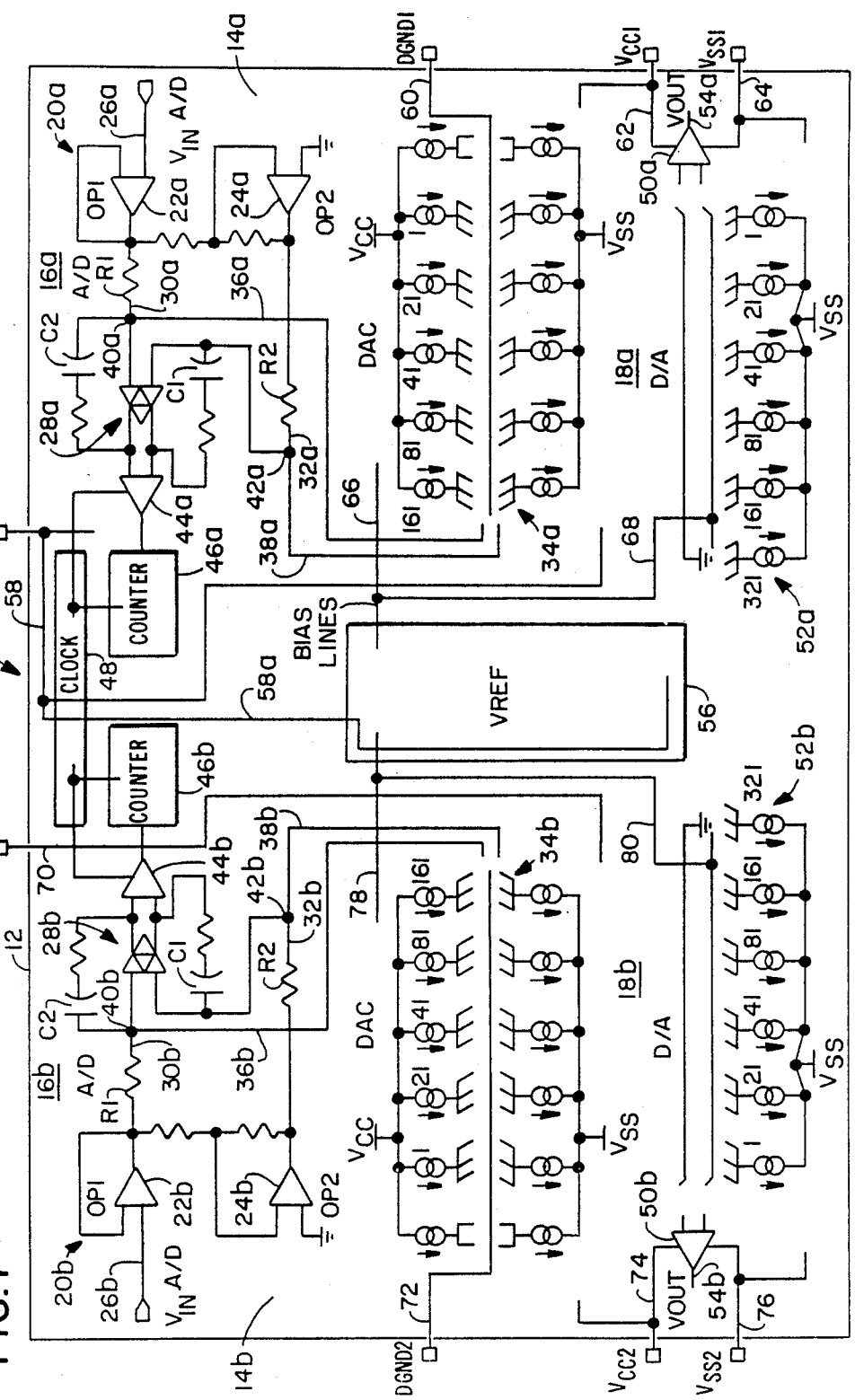
FIG. 1 is a schematic circuit diagram, partly in block form, of a dual channel A/D and D/A converter of the present invention, illustrating its physical lay-out on a single chip substrate.

Referring now in detail to the drawings, there is shown in FIG. 1 a schematic circuit diagram and physical lay-out of a dual channel A/D (analog-to-digital) and D/A (digital-to-analog) converter 10 of the present invention, which is formed on a single semiconductor integrated circuit chip 12. Each channel of the converter 10 is comprised of a linear, time continuous, oversampling A/D and D/A converter 14a (14b) which operates in a differential mode and is implemented without any switched-capacitor architecture. The converter 10 is formed of a unique differential structure having "coaxial" isolation of bus lines and interconnections, thereby achieving a higher degree of unwanted channel-to-channel crosstalk. In practice, the converter 10 of the present invention was found to produce an improvement by a factor of 7 over the −83 db of crosstalk in the prior art structures. The converter 10 achieved crosstalk isolation of as much as −100 db.

The first channel converter 14a is formed of an A/D converter (ADC) circuit 16a and a D/A converter (DAC) circuit 18a. The ADC circuit 16a includes a split input stage 20a formed of two operational amplifiers 22a and 24a which receives an analog voltage input via line 26a. This analog voltage is converted to differential analog current signals by a pair of resistors R1, R2 connected respectively to the outputs of the operational amplifiers 22a, 24a. A differential, time continuous integrator stage 28a receives these current signals via lines 30a and 32a. A six-bit+sign current DAC 34a supplies differential reference currents to the integrator stage 28a via lines 36a and 38a.

Figure 3:
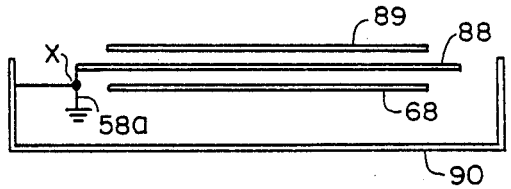
FIG. 3 is a cross-sectional view, illustrating isolation utilizing a shield plate.

The respective analog current signals and reference currents are combined at nodes 40a and 42a. The integrator stage 28a may be of the type similar to AMD Model No. 7949TC1 which is formed of several GM and high gain stages, and a common mode stage for maintaining the differential integrator output centered about a zero at all times. A detailed circuit diagram of the integrator stage 28a is shown in FIG. 3 of the aforementioned U.S. Pat. No. 4,887,085, which is hereby incorporated by reference. The combined currents are integrated by capacitors C1 and C2 whose voltages are fed to the inputs of a comparator 44a. The comparator 44a may be of the type similar to AMD Model No. 7910 which digitizes the signals by comparing the analog current signals with the reference currents generated by the DAC 34a.

A clocked, binary counter 46a is used to increment and decrement the comparison signals from the output of the comparator 44a. The binary counter 46a may be similar to the one commercially available from Texas Instruments under their Part No. 74AS169. The comparator 44a and the counter 46a are driven by a shared clock generator 48 having a frequency 2.048 MHz. The DAC circuit 18a includes operational amplifier 50a and a six-bit current DAC 52a for converting digitized current signals into an analog voltage output at the output of the operational amplifier 50a on line 54a.

Similarly, the second channel converter 14b is formed of an A/D converter (ADC) circuit 16b and a D/A converter (DAC) circuit 18b. The ADC circuit 16b includes a split input stage 20b formed of two operational amplifiers 22b and 24b which receives an analog voltage input via line 26b. This analog voltage is again converted to differential analog current signals by a pair of resistors R1, R2 connected respectively to the output of the operational amplifiers 22b, 24b. A differential, time continuous integrator stage 28b similar to the integrator stage 28a receives these current signals via lines 30b and 32b. A six-bit+sign current DAC 34b supplies differential reference currents to the integrator stage 28b via lines 36b and 38b.

The respective analog current signals and reference currents are combined at nodes 40b and 42b. The combined currents are integrated by capacitors C1 and C2 whose voltages are fed to the inputs of a comparator 44b. The comparator 44b digitizes the signals by comparing the analog current signals with the reference currents generated by the DAC 34b.

A clocked, binary counter 46b is used to increment and decrement the comparison signals from the output of the comparator 44b. The comparator 44b and the counter 46b both driven by the shared clock generator 48. The DAC circuit 18b includes operational amplifier 50b and a six-bit current DAC 52b for converting digitized current signals into an analog voltage output at the output of the operational amplifier 50b on line 54b.

In order to provide isolation between the first channel converter 14a and the second channel converter 14b, a shared reference generator 56 is located substantially in the intermediate area of the chip 12 with the converters 14a and 14b disposed symmetrically on either side of the generator 56. It will be noted that an analog ground bus connection line 58 is fed from a pad AGND1 to both the first channel converter 14a and the reference generator 56. A separate digital ground bus connection line 60, which is susceptible to switching noise, is fed from a pad DGND1 to the current DAC 34a associated with the first channel converter 14a. Thus, this leaves the analog ground bus connection line 58 to be used as a "quiet ground" only for reference and for gate biasing. Further, a first supply voltage connection line 62 is fed from a pad VCC1 to the first channel converter 14a and a second supply voltage line 64 is fed from a pad VSS1 to the first channel converter 14a. As a result, the "high current", flowing in the supply voltage connection lines are separated from the analog ground bus connection line 58, thereby isolating the negative injected noise or IR drops from the common reference generator 56. A first pair of bias connection lines 66, 68 are fed from the reference generator 56 to the first channel converter 14a.

Similarly, an analog ground bus connection line 70 is routed from a pad AGND2 to the second channel converter 14b. A separate digital ground bus connection line 72, which is susceptible to switching noise, is routed from a pad DGND2 to the current DAC 34b associated with the second channel converter 14b. A third supply voltage connection line 74 is fed from a pad VCC2 to the second channel converter 14b, and a fourth supply voltage connection line 76 is fed from a pad VSS2 to the second channel converter 14b. A second pair of bias connection lines 78, 80 are routed independently of the bias line 66, 68 from the reference generator 56 to the second channel converter 14b.

Figure 2:
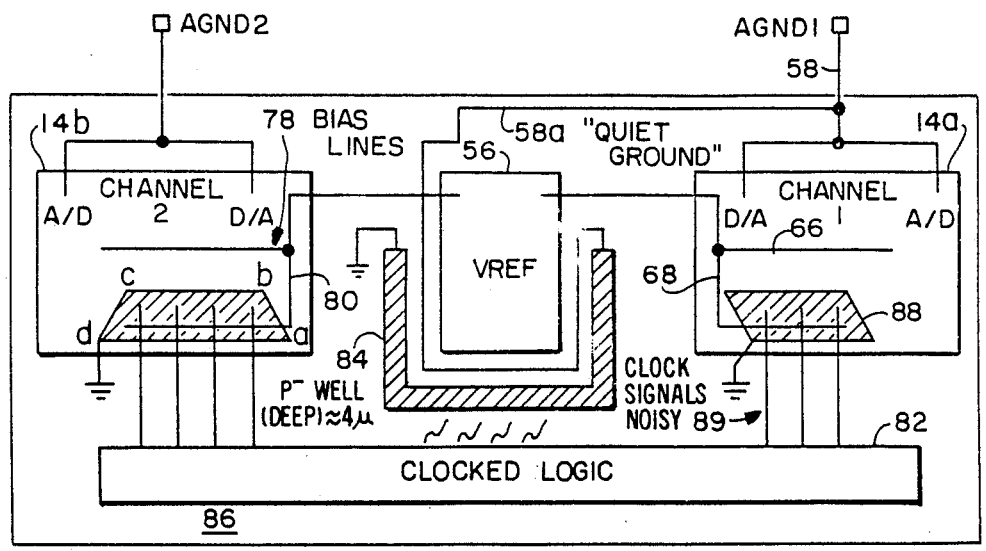
FIG. 2 is a top plan view of the dual channel converter of the present invention, illustrating the physical lay-out of the reference generator block having a barrier.

With reference to FIG. 2, it can be seen that the reference generator 56 functions as a distance barrier between the first channel converter 14a and the second channel converter 14b. As a result, the bias connection lines 66, 68 and 70, 80 are split independently to each channel converter for the respective A/D converters 16a (16b) and D/A converters 18a (18b). In order to further isolate the analog reference generator 56 from the high switching digital clocks in the clocked logic block 82, a p--type well region 84 having a depth of approximately 4 μm (microns) is formed by diffusion in an n-type silicon substrate 86. The reference generator 56 is completely fenced with the analog ground bus connection line 58a defining a "quiet ground" connection line. The well region 84 surrounds a substantial portion of the reference generator 56 and functions as a barrier to prevent substrate induced noise from either of the channel converters 14a, 14b.

For achieving a higher degree of isolation between the channel converters, the bias connection lines 66, 68 and 78, 80 are "coaxially" shielded. As can be seen from FIGS. 2 and 3, a shield plate 68 formed of a piece of almosi (acronym for aluminum, molybdenum, and silicon) material is inserted between, for example, the bias connection line 68 and the noisy clock signal lines 89 of the clock logic block 82 and is then grounded by tying the same to the "quiet ground" connection line 58a. Further a p--type well region 90 is formed under the bias connection line 68 so as to insure isolation from substrate noise. The well region 90 is also tied to the "quiet ground" connection line 58a.

Figure 4:
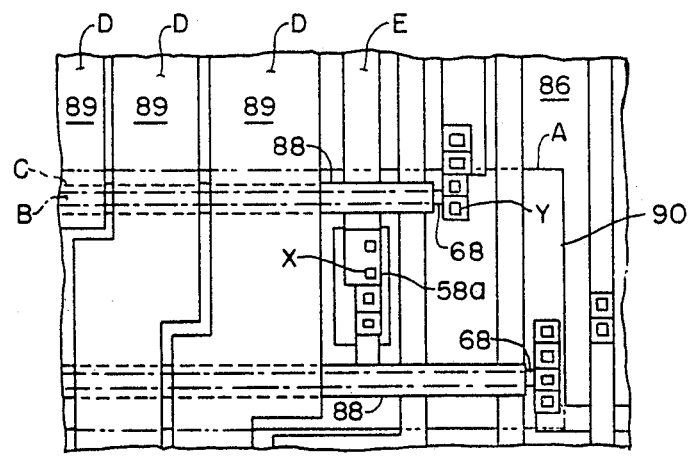
FIG. 4 is a top plan lay-out view, illustrating isolation utilizing a shield plate.

In FIG. 4, there is shown a plan lay-out view of an exemplary shielding. Area A corresponds to the p--type well region 90 of FIG. 3 which is formed in the silicon substrate 86. Area B represents the bias connection line 68 to be protected of FIG. 3, which is formed in the well region 90. Area C represents the shield plate 88 which is disposed above the bias connection line 68. Areas D represent the noisy clock signal lines 89 of FIG. 3, which have been isolated from the bias connection line 68 via the shield plate 88. Area E represents the "quiet ground" connection line 58a of FIG. 3. The connecting area X is a metal layer where contact is made between the "quiet ground" connection line 58a and the p--type well region 90. The connecting area Y is a metal layer where contact is made between the shield plate 88 and the well region 90.

From the foregoing detailed description, it can thus be seen that the present invention provides a dual channel A/D and D/A converter which includes a first channel converter, a second channel converter and a reference generator all formed on a single semiconductor substrate. The reference generator is disposed on the substrate intermediate the first channel converter and the second channel converter for effecting crosstalk isolation therebetween. Further, the dual channel converter is formed of a unique differential structure having "coaxial" isolation of bus lines and interconnections, thereby achieving a higher degree of crosstalk isolation which is on the order of −100 db.

While there has been illustrated and described what is at present considered to be a preferred embodiment of the present invention, it will be understood by those skilled in the art that various changes and modifications may be made, and equivalents may be substituted For elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A dual channel A/D and D/A converter comprising:
   first channel means formed on a single semiconductor substrate for converting between analog signals and digital signals;
   second channel means formed on said semi-conductor substrate at a predetermined distance from said first channel means for converting between analog signals and digital signals;
   reference generator means formed on said semiconductor substrate and disposed intermediate said first channel converter and said second channel converter for functioning as a distance barrier therebetween;
   clock logic means formed on said semi-conductor substrate for generating clock signals on clock connection means;
   first ground connection means coupled to said first channel means defining a quiet ground bus line and which is disposed around said reference generator means to provide isolation from said clock signals;
   second ground connection means coupled to said second channel means and being separated from said first ground connection means; and
   barrier means formed around said quiet ground bus line and said reference generator means to provide further isolation of said first and second channel means from said clock signals.

2. A dual channel A/D and D/A converter as claimed in claim 1, further comprising third ground connection means coupled to said first channel means and defining a first separate digital ground bus connection line.

3. A dual channel A/D and D/A converter as claimed in claim 2, further comprising fourth ground connection means coupled to said second channel connection means and defining a second separate digital ground bus line.

4. A dual channel A/D and D/A converter as claimed in claim 3, further comprising first and second power supply bus connection means for supplying separate power supply voltages to said first channel means.

5. A dual channel A/D and D/A converter as claimed in claim 4, further comprising third and fourth power supply bus connection means for supplying separate power supply voltages to said second channel means.

6. A dual channel A/D and D/A converter as claimed in claim 5, wherein said reference generator means includes first bias connection means for supplying bias voltages to said first channel means and second bias connecting means for supplying bias voltages to said second channel means.

7. A dual channel A/D and D/A converter as claimed in claim 6, further comprising shielding means disposed between said first and second bias connection means and said clock connection means to provide a higher degree of isolation between said first and second channel means.

8. A dual channel A/D and D/A converter as claimed in claim 7, wherein said shielding means is connected to said quiet ground bus line.

9. A dual channel A/D and D/A converter as claimed in claim 8, further comprising a well region formed in said semiconductor substrate below said clock connection means so as to insure isolation from substrate noise.

10. A dual channel A/D and D/A converter as claimed in claim 1, wherein said barrier means comprises a well region having a depth of approximately 4 μm.

11. A dual channel A/D and D/A converter comprising:
   first channel means formed on a single semiconductor substrate for converting between analog signals and digital signals;
   second channel means formed on said semi-conductor substrate at a predetermined distance from said first channel means for converting between analog signals and digital signals;
   reference generator means formed on said semiconductor substrate and disposed intermediate said first channel converter and said second channel converter for functioning as a distance barrier therebetween;
   clock logic means formed on said semi-conductor substrate for generating clock signals on clock connection means;
   first ground connection means coupled to said first channel means defining a quiet ground bus line and which is disposed around said reference generator means to provide isolation from said clock signals;
   second ground connection means coupled to said second channel means and being separated from said first ground connection means;
   barrier means formed around said quiet ground bus line and said reference generator means to provide further isolation of said first and second channel means from said clock signals;
   said reference generator means including first bias connection means for supplying bias voltages to said first channel means and second bias connection means for supplying bias voltages to said second channel means; and
   shielding means disposed between said first and second bias connection means and said clock connection means to provide a higher degree of isolation between said first and second channel means.

12. A dual channel A/D and D/A converter as claimed in claim 11, wherein said shielding means is connected to said quiet ground bus line.

13. A dual channel A/D and D/A converter as claimed in claim 12, further comprising a well region formed in said semiconductor substrate below said clock connection means sc as to insure isolation from substrate noise.

14. A dual channel A/D and D/A converter as claimed in claim 11, wherein said barrier means comprises a well region having a depth of approximately 4 μm.

15. A dual channel A/D and D/A converter comprising:
   first channel means formed on a single semiconductor substrate for converting between analog signals and digital signals;
   second channel means formed on said semi-conductor substrate at a predetermined distance from said first channel means for converting between analog signals and digital signals;
   reference generator means formed on said semiconductor substrate and disposed intermediate said first channel converter and said second channel converter for functioning as a distance barrier therebetween; and
   clock logic means formed on said semi-conductor substrate for generating clock signals on clock connection means.

16. A dual channel A/D and D/A converter as claimed in claim 15, further comprising first ground connection means coupled to said first channel means and defining a quiet ground bus line which is disposed around said reference generator means to provide isolation from said clock signals.

17. A dual channel A/D and D/A converter as claimed in claim 16, further comprising second connection means coupled to said second channel means and being separated from said first ground connection means.

18. A dual channel A/D and D/A converter as claimed in claim 17, further comprising barrier means formed around said quiet ground bus line and said reference generator means to provide further isolation of said first and second channel means from said clock signals.

19. A dual channel A/D and D/A converter as claimed in claim 18, further comprising third ground connection means coupled to said first channel means and defining a first separate digital ground bus connection line.

20. A dual channel A/D and D/A converter as claimed in claim 19, further comprising fourth ground connection means coupled to said second channel means and defining a second separate digital ground bus connection line.

* * * * *